(12) United States Patent
Roberge et al.

(10) Patent No.: US 6,462,489 B1
(45) Date of Patent: Oct. 8, 2002

(54) CONTROLLER FOR A LINEAR ACCELERATOR

(75) Inventors: James Roberge, Lincoln; Robert Joseph Ledoux, Harvard; Boisseau Raymond Paul; William Philip Nett, both of Waltham, all of MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/949,259

(22) Filed: Sep. 10, 2001

Related U.S. Application Data

(62) Division of application No. 09/534,631, filed on Mar. 27, 2000, now Pat. No. 6,329,334.

(51) Int. Cl.$^7$ .......................... H05H 9/00; H01J 25/10; H05B 37/02
(52) U.S. Cl. ..................... 315/505; 315/5.41; 315/362
(58) Field of Search .............................. 315/505, 5.41, 315/111.61, 344, 267, 362; 250/492.21, 492.2

(56) References Cited

U.S. PATENT DOCUMENTS

| | | | |
|---|---|---|---|
| 4,490,648 A | 12/1984 | Lancaster et al. | 315/5.41 |
| 4,667,111 A | 5/1987 | Glavish et al. | 250/492.2 |
| 4,712,042 A | 12/1987 | Hamm | 315/5.41 |
| 4,801,847 A | 1/1989 | Sakudo et al. | 315/5.41 |
| 5,003,183 A | 3/1991 | Nogami et al. | 250/492.2 |
| 5,229,615 A | 7/1993 | Brune et al. | 250/492.2 |
| 5,280,252 A | 1/1994 | Inoue et al. | 315/500 |
| 5,451,847 A | 9/1995 | Nakanishi | 315/505 |
| 5,504,341 A | 4/1996 | Glavish | 250/492.21 |
| 5,801,488 A | 9/1998 | Fujisawa | 315/5.41 |
| 5,825,140 A | 10/1998 | Fujisawa | 315/505 |
| 6,207,964 B1 | 3/2001 | McIntyre et al. | 250/492.21 |
| 6,208,095 B1 | 3/2001 | DiVergilio et al. | 315/505 |
| 6,239,541 B1 | 5/2001 | Fujisawa | 313/359.1 |
| 6,242,747 B1 | 6/2001 | Sugitani et al. | 250/396 R |

FOREIGN PATENT DOCUMENTS

| | | | |
|---|---|---|---|
| JP | HEI757897 | 3/1995 | |
| JP | HEI757898 | 3/1995 | |
| JP | 08017597 A | 1/1996 | ............ H05H/9/00 |
| JP | HEI9237700 | 9/1997 | |
| WO | WO9913488 | 3/1999 | |

Primary Examiner—N. Le
Assistant Examiner—Wasseem H. Hamdan
(74) Attorney, Agent, or Firm—Boult Wade Tennant

(57) ABSTRACT

A method and apparatus for generating an accurate, stable phase shift (b) in a sinusoidal signal employs fast analog multiplication to implement the trigonometric relationship $\sin(\omega t+b)=\sin(\omega t)\cos(b)+\cos(\omega t)\sin(b)$. $\cos(\omega t)$ is generated by accurately shifting a signal $\sin(\omega t)$ through 90° C. using a delay line, for example. Sin(b) and cos(b) are dc signals generated by digital to analog conversion, using a demanded phase shift (b) whose sine and cosine are obtained from look-up tables. A controller for controlling a phase shift in an rf cavity is also disclosed and operates on the basis of the same trigonometrical principle. The amplitude of the signals in the rf cavity is also controllable; fast analog multipliers are again employed to scale the signal amplitude to a nominal fixed value such as 1 volt.

9 Claims, 11 Drawing Sheets

CONTROLLER FOR A LINEAR ACCELERATOR

This application is a divisional of co-pending application Ser. No. 09/534,631, filed on Mar. 27, 2000, now U.S. Pat. No. 6,329,334 the entire contents of which are hereby incorporated by reference and for which priority is claimed under 35 U.S.C. §120; and this application claims priority of application no. filed in on under 35 U.S.C. §119.

FIELD OF THE INVENTION

The invention is concerned with a controller for a linear accelerator, particularly but not exclusively for use in an ion implanter.

BACKGROUND OF THE INVENTION

A linear accelerator structure accelerates charged particles of a specific mass/charge ratio which are injected into the accelerator at a specific injection energy Radio frequency (rf) linear accelerators have been known for many years from the field of nuclear physics where they have been employed to accelerate heavy ions. More recently, rf accelerators have been used in semiconductor wafer processing. Typically, a beam of ions of a required species (such as boron, phosphorous, arsenic or antimony) is produced and directed at a wafer so that the ions become implanted under the surface of that wafer. Although electrostatic acceleration systems are suitable for producing beams of singly charged ions of 200 keV or more, it has been recognised that the desirable characteristics (for certain applications) of relatively high beam current and relatively high beam energy can be achieved by including an rf accelerator in the ion implanter device.

The use of rf linear accelerators for implantation of ions into semiconductor wafers has been suggested at least since 1976 in "Upgrading of Single Stage Accelerators" by K. Bethge et al, pages 461–468, Proceedings of the Fourth Conference on the Scientific & Industrial Applications of Small Accelerators, North Texas State University, Oct. 27–29, 1976; and in "Heavy Ion Post-acceleration on the Heidelberg MP Tandem Accelerator", edited by J. P. Wurm, Max Planck Institute for Nuclear Physics, Heidelberg, May 1976. U.S. Pat. No. 4,667,111 discloses an ion implanter incorporating a radio frequency linear accelerator to provide ultimate beam energies as high as 2 MeV or more.

As discussed by Glavish et al in "Production of high energy ion implanters using radio frequency acceleration", Nuclear Instruments and Methods in Physics Research B21 (1987), at pages 264 to 269, it is necessary that each resonator in the rf accelerator be kept in precise tune and matched to its amplifier, for example by feedback control of a movable plate capacitor. The resonators tend to be sensitive to thermal and mechanical disturbances as they are part of highly tuned systems, with Q values between 1000 and 2000. It is also important that the amplitude and phase of the rf voltage at the acceleration electrode be controlled. In one arrangement, a signal from the inductive or capacitive probes associated with each cavity is compared with the desired phase and amplitude derived from a master oscillator via a precision phase shifter. Using a microprocessor, a "parameter set" for a given ion beam energy and species may be developed. Phase may be held to about 1° and amplitude to within 1%.

U.S. Pat. No. 5,801,488 also describes the control of an rf accelerating device. Here, a control unit determines the respective values of phase and rf power, based upon a predetermined programmed algorithm, to obtain a target energy which is set by an operator. The controller adjusts the phase and amplitude under feedback control. In "The Development of a Beam Line using an RFQ and 3-Gap RF Accelerators for High Energy Ion Implanters", presented by Fujisawa et al at IIT in Kyoto, Japan, Jun. 24 1998, a personal computer is employed to control phase and amplitude to an RFQ and 3-gap rf beam line. Again, phase is controlled to around 1° and amplitude to around 0.5%.

It will thus be appreciated by those skilled in the art that the precision and stability of the system relies upon the ability to generate a signal, for each resonator, which has a precise phase and amplitude. It is also important that the relative phase shift between resonators is accurately maintained.

SUMMARY OF THE INVENTION

One object of the present invention is accordingly to stabilize and set the phase shift between signals as it fluctuates due to mechanical or thermal drift, for example. It is a further object to provide a technique for introducing an accurate chosen phase shift into a sinusoidal signal. Still a further object is to accurately determine and control the amplitude of such a signal.

In a first aspect of the invention, here is provided a controller for controlling a phase shift between a reference signal and a measured signal in an rf resonator having an rf power supply, the controller comprising an oscillator for providing a reference sinusoidal signal having a reference phase; a detector for generating a transduced signal from the rf resonator, the transduced signal having a detected phase; a phase shifter apparatus including a quadrature signal generator arranged to shift the phase of the reference sinusoidal signal by 90° relative to the reference phase so as to generate a reference cosinusoidal signal; a phase demand signal generator arranged to generate a first phase demand signal representing the sine of a desired angle of phase shift of the said reference sinusoidal signal plus a further 90° phase shift, and to generate a second phase demand signal representing the cosine of the said desired angle of phase shift plus a further 90° phase shift; a first multiplier arranged to multiply the said cosinusoidal reference signal with the first phase demand signal representing the sine of desired angle of phase shift plus 90° to generate a first composite signal, and a second multiplier to multiply the said sinusoidal reference signal with the second phase demand signal representing the cosine of the desired angle of phase shift plus 90° generate a second composite signal; and a summer arranged to sum the first and second composite signals to generate a phase shifter output signal which is a second sinusoidal signal that is shifted in phase relative to the reference phase of the reference sinusoidal signal by the said desired angle of phase shift plus 90°, the second sinusoidal signal being equivalent to a second cosinusoidal signal that is shifted in phase relative to the reference phase of the reference cosinusoidal signal by the said desired angle of phase shift; a second multiplier arranged to multiply the transduced signal with the second cosinusoidal signal and to generate a phase error signal having a dc component from the resultant product; and a processor arranged to generate a control signal on the basis of the dc component of the phase error signal, to control the output of the said power supply so as to minimize the dc phase error signal.

The controller of the present invention relies upon the trigonometrical identity $$\sin(\omega t+b)=\sin(\omega t)\cos(b)+\cos(\omega t)\sin(b)$$

where the phase shift in the sinusoidal signal is represented by "b".

Sin(b) and cos(b) are dc values which may be accurately generated. Thus, precise linear adjustment of the phase shift relative to a master oscillator may be provided. The phase angle "b" may be continuously adjusted over a full 360° and with no discontinuity. The linearity and stability of the apparatus is also improved relative to the prior art.

It is desirable to ensure that the phase of the second sinusoidal signal (having a "demand phase" accurately determined using the trigonometrical function outlined above) is identical with the phase of the rf signal in the rf resonator which is obtained by the detector. When this is the case, the product of the second sinusoidal signal, shifted by exactly 90°, (so that it becomes the second cosinusoidal signal) and the transduced signal, should be zero. This principle can be used to provide a phase controller which uses the accurately determined phase shift as a reference to which the phase of the rf signal in the resonator cavity is locked via closed loop feedback. With this technique, phase can be controlled to about 0.5°. It will be appreciated that, instead of shifting the desired phase angle by 90° so as to produce, in effect, the second cosinusoidal signal, a quadrature signal of the transduced signal may instead be multiplied by a sinusoidal signal shifted by the chosen phase shift only (that is, not by an additional 90°) to create a phase error signal having a dc component. Alternatively, this sinusoidal signal (phase shifted by the desired angle of phase shift only) can be generated and then passed through a second quadrature signal generator which converts it, in effect, into the second cosinusoidal signal.

The quadrature signal generator may, for example, be an accurate single delay cable. Although this is adequate for a fixed frequency apparatus, a stripline structure is preferred for variable frequency devices. For example, the stripline structure, provided with taps and jumpers, can be embedded into a circuit board. This potentially allows sub-nanosecond adjustment of the time delay provided by the sub-nanosecond structure, such that a precise 90° phase shift can be made to the first sinusoidal signal for a range of signal frequencies.

The multiplier is in preference a fast analogue multiplier, such as the high precision AD834 or AD835 multiplier manufactured by Analog Devices. In that case, the d.c. values of sin(b+90) and cos(b+90) may be generated by a digital to analog converter (DAC). In preference, a pair of 16 bit DAC's are employed, operating under microprocessor control.

The controller of the invention is particularly suitable for application to a resonator which is part of an rf accelerator. Specifically, it may be desirable to apply a signal of a first known relative phase to a first resonator, and to apply a signal of a second known relative phase to a second resonator which Is, for example, downstream of the first resonator This may be done using a single apparatus controller arranged to generate two separate phase shifts relative to a common signal having a reference phase, or by using two separate apparatuses (again preferably relying upon a common signal having a reference phase). It may desirable that the first and the second relative phases are equal, that is, there is no phase difference between the signal applied to the first and the signal applied to the second resonator.

The controller may further comprise scaling means for attenuating the amplitude of the reference sinusoidal signal by a predetermined fraction to generate a scaled reference sinusoidal signal having a predetermined amplitude. Likewise, the scaling means may be further arranged to attenuate the amplitude of the reference cosinusoidal signal by the predetermined fraction to generate scaled reference cosinusoidal signal having the said predetermined amplitude.

The scaling means may be further arranged to attenuate the amplitude of the transduced signal by the said predetermined fraction.

In one embodiment, the scaling means may be arranged to attenuate the demand signal generated by the processor to a predetermined fixed amplitude.

The controller may further comprise signal processor means arranged to control the amplitude of the rf signal in the rf resonator, the signal processor means being configured to receive the said transduced signal from the detector, and to calculate an amplitude error signal by comparing the amplitude of the said transduced signal with a reference signal having a reference amplitude; the controller being further arranged to adjust the amplitude of the control signal generated by the processor in dependence upon the said amplitude error signal so as to minimize the amplitude error signal.

The analog multipliers of preferred embodiments have a maximum input voltage of 1.25 V peak and scaling the signals is therefore desirable. Furthermore, scaling the signals to a reference voltage eliminates the effects of non-linearities which arise in amplitude detection circuitry.

In a further aspect of the invention, there is provided a controller for controlling a phase shift between a reference signal and a measured signal in an rf resonator having an rf power supply, the controller comprising an oscillator for providing a reference sinusoidal signal having a reference phase; a detector For generating a transduced signal from the rf resonator, the transduced signal having a detected phase; a phase shifter apparatus including a quadrature signal generator arranged to shift the phase of the reference sinusoidal signal by 90° relative to the reference phase so as to generate a reference cosinusoidal signal; a phase demand signal generator arranged to generate a first chase demand signal representing the sine of a desired angle of phase shift of the said reference sinusoidal signal, and to generate a second phase demand signal representing the cosine of the said desired angle of phase shift; a first multiplier arranged to multiply the said cosinusoidal reference signal with the second phase demand signal representing the cosine of the desired angle of phase shift to generate a first composite signal, and to multiply the said sinusoidal reference signal with the first phase demand signal representing the sine of the desired angle of phase shift to generate a second composite signal; a summer arranged to generate a phase shifter output signal by determining the difference between the said first and said second composite signals, the phase shifter output signal being a second cosinusoidal signal which is shifted in phase relative to the reference phase of the reference cosinusoidal signal by the said desired angle of phase shift; and a second multiplier arranged to multiply the transduced signal with the second cosinusoidal signal and to generate a phase error signal having a dc component from the resultant product; and a processor arranged to generate a demand signal on the basis of the dc component of the phase error signal, to control the output of the said rf power supply so as to minimize the phase error signal.

Here, the trigonometrical relationship $$\cos(\omega t+b)=\sin(\omega t)\sin(b)-\cos(\omega t)\cos(b)$$

is employed, so that the resultant phase shifted signal is cosinusoidal.

In further aspects of the invention, methods of controlling a phase shift between a reference signal and a measured signal are provided.

In still a further aspect of the present invention, there is provided an apparatus for measuring the amplitude of an rf signal in an rf resonator having an rf power supply, comprising a signal processor means configured to receive as a first input, a transduced signal representative of the amplitude of the rf signal, and to receive, as a second input, a command scaling signal having a predetermined amplitude, the signal processor means being arranged to generate a scaled transduced signal having an amplitude scaled by an amount directly proportional to the predetermined command scaling signal amplitude; means for generating a reference signal having a reference amplitude; a comparator arranged to compare the amplitude of the scaled transducer signal with the reference amplitude of the reference signal and to generate an amplitude error signal representative of the difference between the scaled transducer signal amplitude and the reference signal amplitude; the signal processor means being further arranged to adjust the output of the rf power supply in dependence upon the amplitude error signal so as to minimize the subsequent difference between the scaled transducer signal amplitude and the reference signal amplitude.

By scaling the transduced signal rather than trying to measure the amplitude directly, the inaccuracy arising from the non-linearities present in peak measurement devices is eliminated.

A fast analog multiplier may be used to carry out scaling. One of the multiplicands is the transduced signal to be scaled, and the other is a variable analog signal generated, for example, by a DAC. Suitably, pre-scaling by a fixed fraction is also carried out, for example by using a network of resistors.

The invention also extends to a phase shifter apparatus for generating a phase shift in a sinusoidal signal, comprising: an oscillator for generating a first sinusoidal signal having a reference phase; a quadrature signal generator arranged to shift the phase of the said sinusoidal signal by 90° relative to the said reference phase so as to generate a first cosinusoidal signal; a desired phase shift signal generator arranged to generate a first phase signal representing the sine of a desired angle of phase shift of the said first sinusoidal signal, and a second phase signal representing the cosine of the said desired angle of chase shift; a first multiplier arranged to multiply the said cosinusoidal signal with the first phase signal representing the sine of the said desired angle of phase shift, to generate a first composite signal, and a second multiplier to multiply the said sinusoidal signal with the second phase signal representative of the cosine of the said desired angle of phase shift, to generate a second composite signal; and a summer arranged to sum the first and second composite signals to generate a phase shifter output signal which is a second sinusoidal signal that is shifted in phase relative to the reference phase of the first sinusoidal signal by the said desired angle of phase shift.

In still a further aspect of the present invention there is provided a phase shifter apparatus for generating a phase shift in a cosinusoidal signal comprising: an oscillator for generating a first sinusoidal signal having a reference phase; a quadrature signal generator arranged to shift the phase of the said sinusoidal signal by 90° relative to the said reference phase so as to generate a first cosinusoidal signal; a desired phase shift signal generator arranged to generate a first phase signal representing the sine of a desired angle of phase shift of the said first sinusoidal signal, and a second phase signal representing the cosine of the said desired angle of phase shift; a first multiplier arranged to multiply the said first cosinusoidal signal with the second phase signal representing the cosine of the said desired angle of phase shift to generate a first composite signal, and a second multiplier to multiply the said first sinusoidal signal with the said first phase signal representing the sine of the said desired angle of phase shift to generate a second composite signal; and a summer arranged to generate an output representative of the difference between the said first and second composite signals, which output is a second cosinusoidal signal that is shifted in phase by the said desired angle of phase shift relative to the phase of the first cosinusoidal signal Methods of generating a phase shift in a sinusoidal signal and in a cosinusoidal signal are also provided by the invention.

The invention also extends to an rf accelerator including a controller incorporating the invention as defined in the claims, and to an ion implanter for implanting ions into a substrate employing such an rf accelerator.

There follows by way of example only a description of a preferred embodiment of the invention.

DESCRIPTION OF THE PREFERRED EMBODIMENTS

Figure 1:
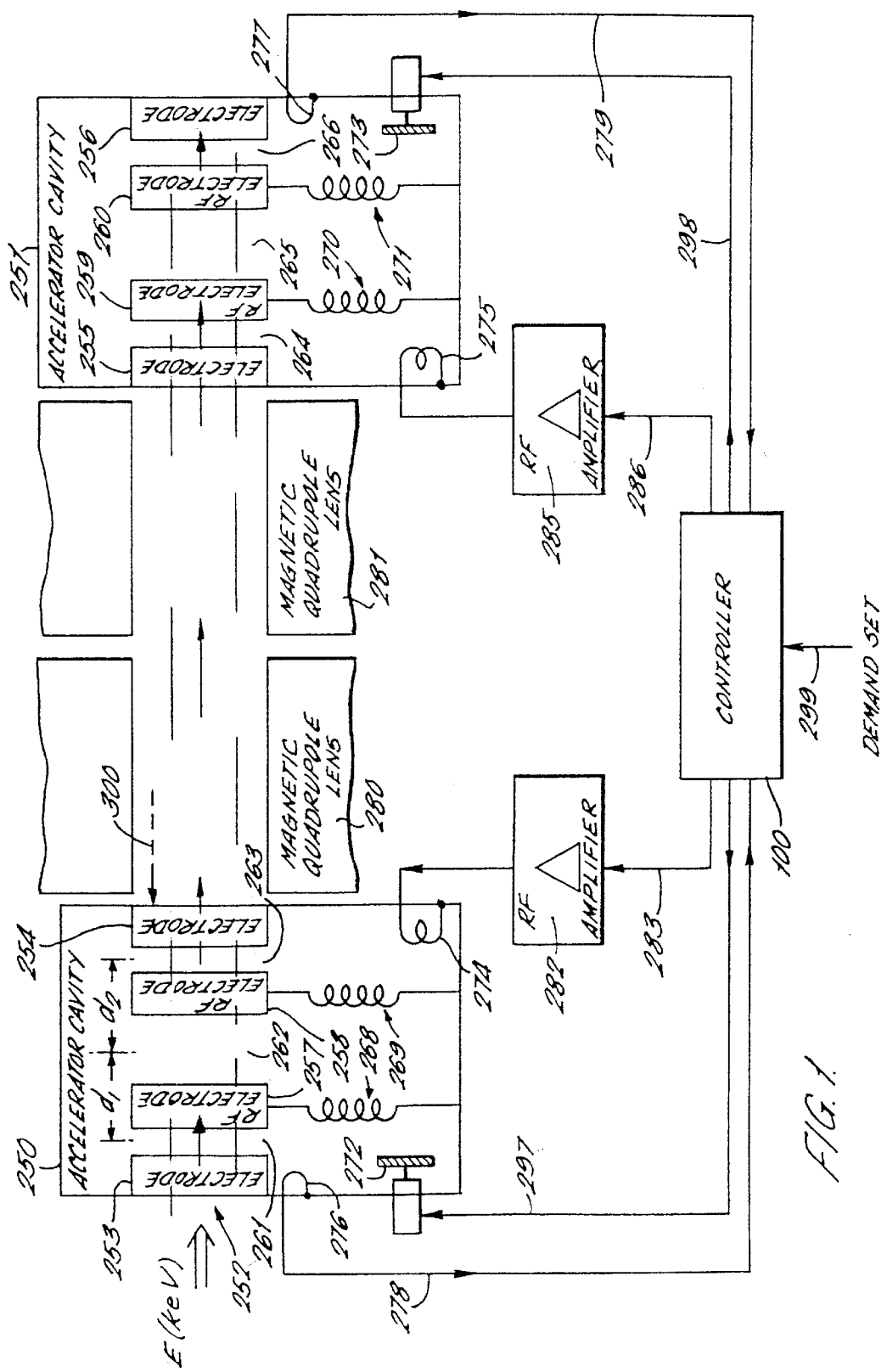
FIG. 1 shows a schematic view of an rf accelerator assembly including a controller embodying certain aspects of the present invention.

Referring to FIG. 1, a schematic diagram or an rf accelerator assembly is shown. The illustrated assembly comprises first and second rf accelerator cavities or stages 250 and 251 respectively arranged in tandem for changing the energy of a beam 252 of ions. The beam 252 is injected into the first rf accelerator cavity 250 at energy E (keV).

Each cavity 250, 251 is preferably a three gap cavity having grounded entrance and exit electrodes 253, 254 and 255, 256 respectively and a pair of intermediate rf electrodes 257, 258 and 259, 260 respectively. The electrodes of the first cavity 250 define a first gap 261, between entrance electrode 253 and first rf electrode 257, a second gap 262 between the two rf electrodes 257 and 258, and a third gap 263 between the second rf electrode 258 and the exit electrode 254. The cavity 251 has similar caps 264, 265 and 266.

The rf electrodes 257 and 258 of the first cavity 250 are connected to coils 268 and 269, and the rf electrodes 259 and 260 of the second cavity 251 are connected to coils 270 and 271. Each cavity 250, 251 incorporating the respective electrodes and coils, provides a resonant tank designed to have a resonant frequency at or around a predetermined value f which is the intended operating frequency of the rf accelerator. The arrangement shown schematically in FIG. 1 is described in more detail in commonly assigned patent application Ser. No. 09/321,731, filed May 28, 1999 and entitled "Ion implanter and a method of implanting ions", the contents of which are incorporated by reference in their entirety.

The resonance of the cavities 250 and 251 can be fine tuned to match the desired operating frequency f by means of adjustable tuning capacitors 272 and 273, as will be detailed further below. Rf energy is coupled to the respective cavities 250, 251 via coupling loops 274 and 275. Pick up loops 276 and 277 in the respective cavities provide an output on lines 278 and 279 providing a feedback signal representing the amplitude and phase of the rf voltage in the respective cavity. This feature will be described in more detail particularly in connection with FIGS. 2, 3 and 7 below.

A pair of magnetic quadrupole lenses 280 and 281 are located in sequence between the cavities 250 and 251.

An rf amplifier or power supply 282 amplifies an rf drive signal on a line 283 from an rf generator in controller 100 and supplies the amplified rf signal to energise the coupling loop 274 in the first rf cavity 250. Similarly a second rf amplifier 235 amplifies an rf drive signal on a line 286 from a second rf generator in the controller 100 to supply an amplified rf signal to the coupling loop 275 of the second rf cavity 251.

It is an important feature of all rf linear accelerators that the phase of the rf fields in each of the cavities not drift. Phase drift can result in bunches of charged particles passing through the accelerator not receiving the prescribed and preset acceleration. Furthermore, it should be appreciated that the resonant tank circuits 250 and 251 are provided to ensure that the required rf potential is applied to the rf electrodes in the respective cavity with minimum ohmic losses. The resonant circuits tend to have a high Q value (1000 to 2000) and this means that any small thermal or mechanical disturbance will move the circuits rapidly off resonance. Accordingly, it is very important that the resonance of the tank circuits is accurately maintained at the fixed frequency f of the rf drive. Deviation of the tank circuit resonance from the drive frequency f requires the amplitude of the rf drive to be increased for the same rf voltage applied to the electrodes of the cavity. Also, if she resonance of the cavity drifts away from the frequency f, in the absence of feedback control, there would be a change in the phase of the rf voltage on the electrodes.

The controller 100 of FIG. 1 thus employs both fast electronic feedback for small deviations in the resonance of the cavity, and slower, mechanical feedback to ensure that the resonance of the cavities remains at the drive frequency f when, for example, thermal expansion occurs. The principles of the fast feedback control are described in connection with FIGS. 2 to 6 (for phase control) and 7–8 (for amplitude control). Slow mechanical feedback control is preferably carried out by tuning the variable capacitance 272 and 273 of the respective cavities, by applying control signals on lines 297 and 298 respectively to dc or stepper motors. Typically, the tuner can adjust the frequency over a range of approximately 40 kHz. The phase difference between the control or command phase and the transduced phase will be either positive or negative and this in turn can provide an indication of the required direction of movement of the plates of the variable capacitor.

Because the variable capacitor 272 is a mechanical device, the response time of the variable capacitor 272 is relatively slow. Thus, fast electronic feedback control of the rf drive signal (as set out below) is required to maintain accurate amplitude and fixed phase within the cavity in response to any fast changes in the feedback signal, such as can arise due to mechanical vibration of the cavity. On the other hand, the capacitance 272 is adjusted to compensate for slow changes in the resonance of the cavity, e.g. resulting from thermal expansion. The slower mechanical feedback technique does not form a part of the present invention and in any event is disclosed in the above referenced U.S. Ser. No. 09/321,731.

Figure 2:
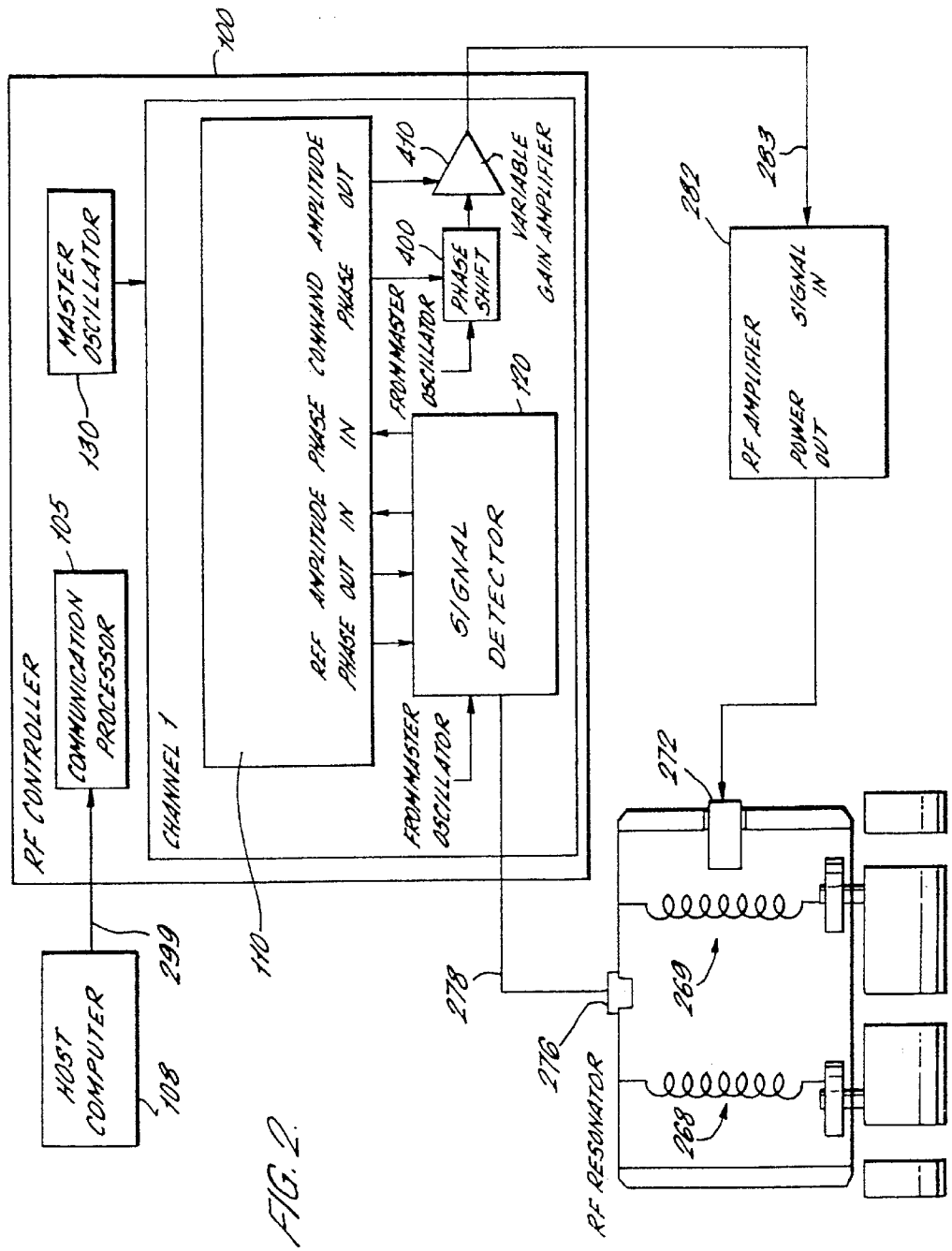
FIG. 2 shows a schematic close-up view of the controller of FIG. 1.

FIG. 2 shows a simplified block diagram of the controller 100 of FIG. 1, together with a highly schematic representation of some of the features of an rf resonator. For simplicity of explanation, only one resonator is shown in FIG. 2 although it will be understood that the controller can control two rf resonators (as is shown schematically in FIG. 1) or more. Features common to FIGS. 1 and 2 have been labelled with like reference numerals.

The controller 100 includes a communication processor 105 which provides two-way communication with a host computer 108, for example using an RS-232 interface. The host computer 108 enables user-defined parameters to be sent to the controller 100 by a system operator.

It is a known requirement in the construction of multiple cavity linear accelerators to ensure that bunches of ions accelerated by a first cavity arrive at the first gap of the second cavity, when the rf voltage across this first gap is at an appropriate value to provide the required acceleration to the bunch of ions. A different set-up of any linear accelerator is required for use with ions of different mass-to-charge ratio, because the speed of the ions emerging, even with the same energy, from the first cavity will be different depending upon that mass-to-charge ratio. Although various parameters may be changed, it is preferable to maintain the distance between the two cavities 250 and 251, and to maintain the phases of the rf voltages in the two cavities 250 and 251, but to set up the accelerator for the desired ion mass-to-charge ratio by adjusting the speed of the ions from the first cavity to the second. This is achieved, in the illustrated example, by adjusting the amplitude of the signal supply to the resonator coil 268. Thus, the host computer 108 allows different demand amplitudes to be loaded into the controller 100, depending upon the mass-to-charge ratio of the ions in the ion beam E.

In addition to the communication processor 105, the controller 100 also includes a control processor 110, a signal detector 120 and a master oscillator 130. The master oscillator 130 is common to each of the channels, although only one channel (labelled channel 1) is shown in FIG. 2. The detector 120 receives a pick-up signal on line 278 from pick-up loop 276 adjacent resonator coil 268. The control processor 110 and the signal detector 120 between them determine the amplitude and phase of the signal detected by the pick-up loop 276. Once these values have been determined, they may be compared with a desired amplitude and phase to ascertain amplitude and phase error signals respectively.

The control processor 110 provides command phase and command amplitude signals to a phase shifter 400 and a variable gain amplifier 410 respectively. These are supplied on line 283 to the amplifier 282 which drives the coils 268, 269. The command phase and command amplitude values are chosen so as to adjust the amplitude and phase of the signal supplied to the coils 268 and 269 from the amplifier 282, so that the difference between the desired and measured phase/amplitude in the resonator is minimised.

Figure 3:
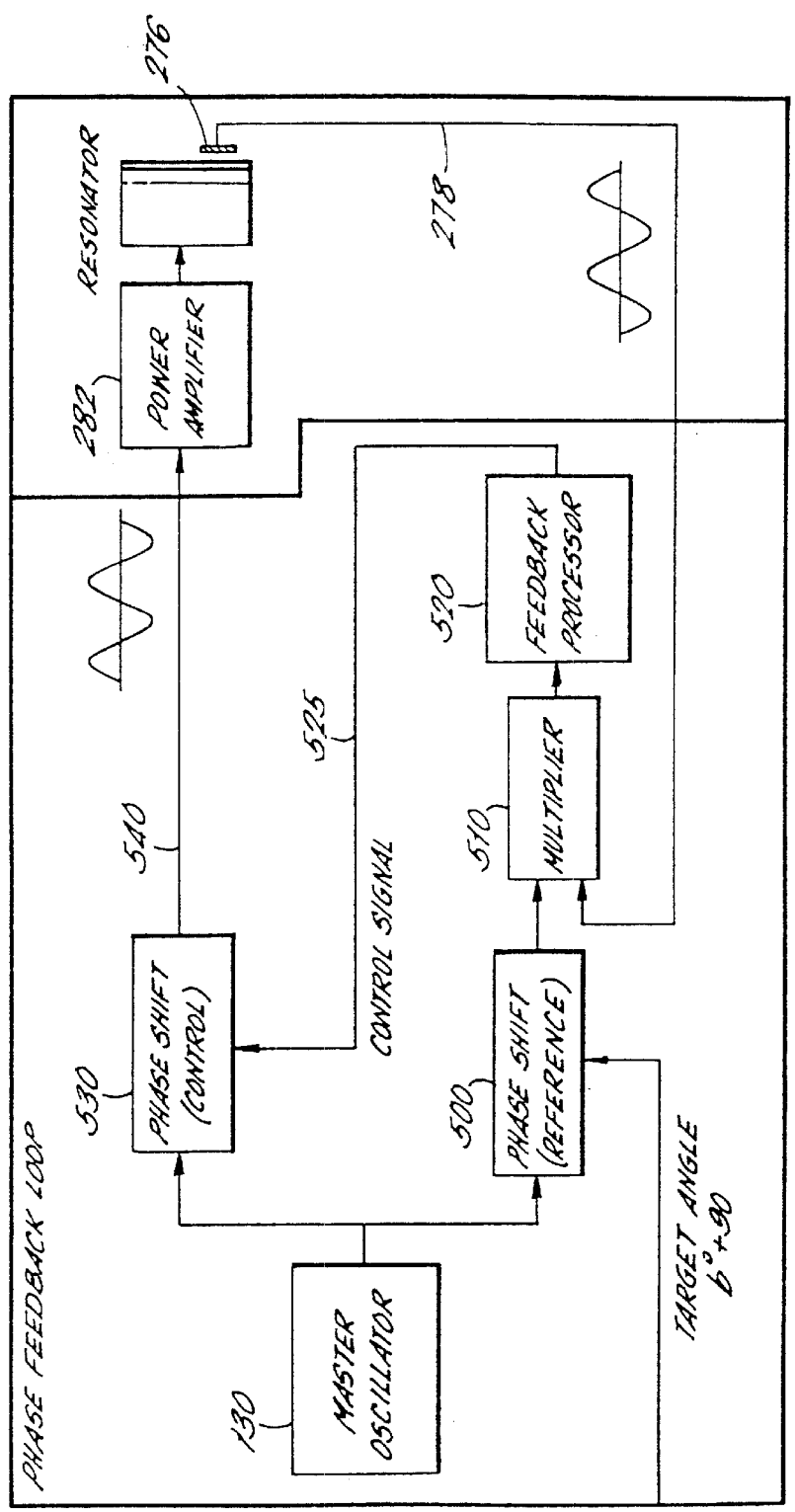
FIG. 3 shows, in further detail, a phase feedback loop constituting a part of the controller of FIG. 2.

FIG. 3 shows, in further detail, a phase feedback loop constituting a part of the controller 100 of FIG. 2. As will be appreciated, in order for ion acceleration to occur, each rf resonator must have a precisely defined phase relationship to a master oscillator 130.

FIG. 3 shows a schematic diagram of the feedback loop used to establish and maintain the phase shifts.

A master oscillator 130 generates a sinusoidal wave having a reference phase. It will of course be appreciated that phase is a relative quantity. However, other signals within the phase feedback loop may have a phase relative to the phase of the sinusoidal wave generated by the master oscillator 130 and the phase angle of the sinusoidal wave generated by the master oscillator 130 is therefore considered to be 0° to facilitate explanation. The sinusoidal wave generated by the master oscillator 130 is hereinafter termed a "reference sine wave".

The reference sine wave from the master oscillator 130 is sent as a first input to a reference phase shifter 500. The host computer 108 (FIG. 2) also supplies a target phase angle of b° to the reference chase shifter 500. The reference phase shifter 500 shifts the phase of the reference sine wave by b°. In other words, if the reference sine wave is represented as $\sin(\omega t)$, then the reference phase shifter 500 operates to generate a phase-shifted sine wave which may be mathematically represented as $\sin(\omega t+b)$.

The phase-shifted sine wave is further phase-shifted through exactly 90° to generate a sine wave of the form $\sin(\omega t+b+90)$. This is, of course, a cosinusoidal wave, $\cos(\omega t+b)$.

The principles of operation of the reference phase shifter 500 will be described in further detail in connection with FIGS. 4 and 5. However, it should be appreciated that although the additional 90° phase shift imparted by the phase-shifter is most preferably carried out by employing a target phase angle of (b+90), a similar result could be obtained by using a target phase angle b and then using, for example, an accurate delay line to shift the phase-shifted sine wave $\sin(\omega t+b)$ by a further 90°.

The resultant phase-shifted cosinusoidal wave, $\cos(\omega t+b)$, is used as a first input to a multiplier 510. The multiplier also receives an input on line 278 from the pick-up loop 276 adjacent the resonator (FIG. 2). The signal received from the pick-up loop 276 is a sine wave which should, in principle, be phase-shifted relative to the reference sine wave of the master oscillator 130 via the target phase angle b. In other words, the signal from the pick-up loop 276 should be of the form $\sin(\omega t+b)$.

The input to the multiplier 510 from the reference phase shifter 500 is (as previously explained) an accurately gen-erated signal of the form $\cos(\omega t+b)$, having the same frequency as the signal from the pick-up loop 276. If the signal from the pick-up loop 276 is exactly $\sin(\omega t+b)$, then the product of this and $\cos(\omega t+b)$ will have a DC component having zero amplitude. This condition is independent of the relative amplitudes of the two signals input to the multiplier 510.

Using this principle, a feedback loop can be generated. When the signal from the pick-up loop 276 is not exactly $\sin(\omega t+b)$, but instead has a slightly different phase relative to the reference sine wave such as $\sin(\omega t+b+\Delta b)$, the multiplier will yield an output having a non-zero dc component The DC signal generated by the multiplier 510 is received by a processor 520, such as a digital signal processor. The processor calculates a phase demand signal which is passed along line 525 to a control phase shifter 530. The control phase shifter 530 receives the reference sine wave from the master oscillator 130 together with the phase demand signal from the processor 520. Again using the technique described in FIG. 4, the control chase shifter 530 generates an output command wave form on line 540 which is a sine wave having the same frequency as the reference sine wave but which is phase-shifted by an angle $x°$. The phase angle x is typically similar to the target phase angle b, but is calculated so as to drive the actual phase of the signal in the resonator (measured by pick-up loop 276) to have a phase angle as close to b as possible; that is, to drive $\Delta b$ to zero. This is achieved by applying the output command wave form to the power amplifier 282 which in turn drives the resonator.

Figure 4:
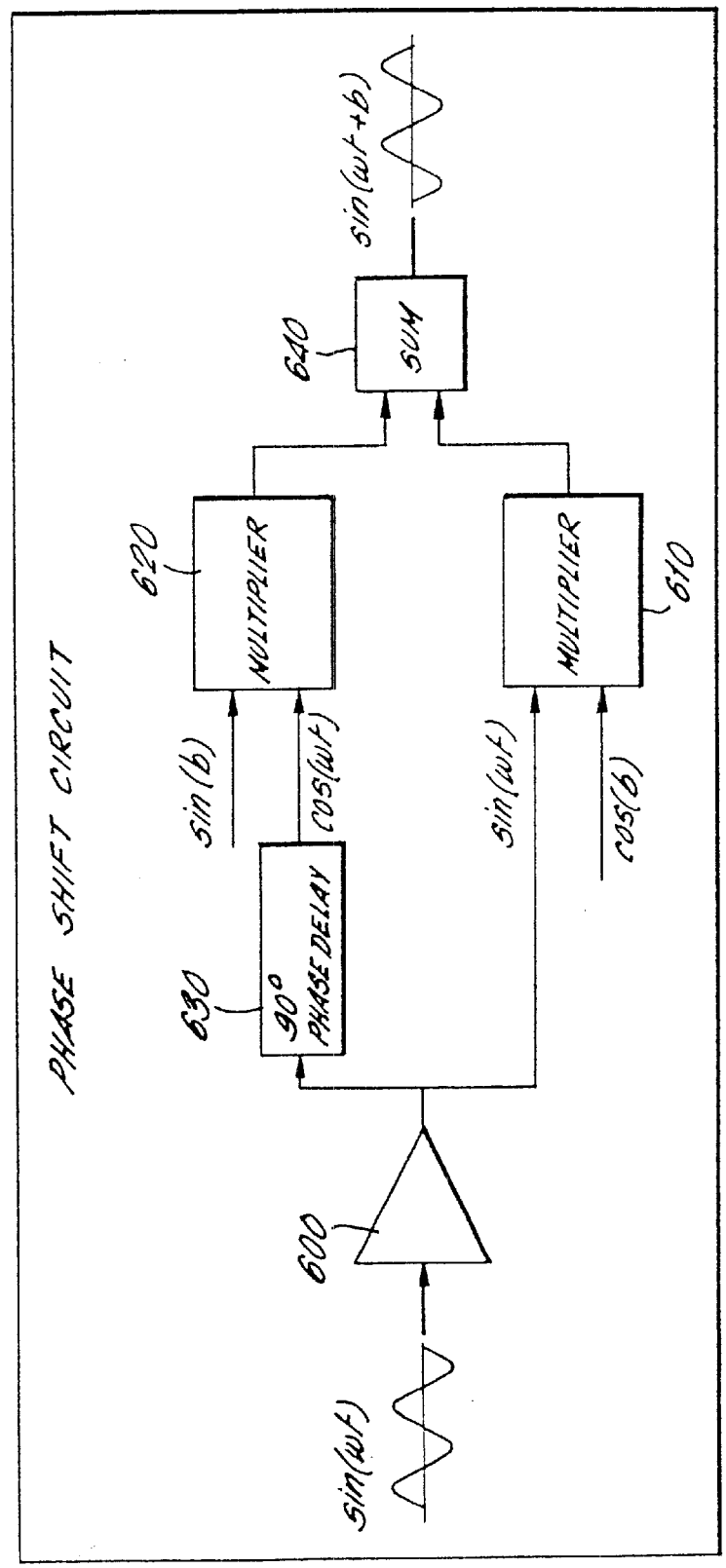
FIG. 4 shows a schematic diagram of a phase shift circuit suitable for use in the phase feedback loop of FIG. 3.

Turning now to FIG. 4, a schematic diagram of a phase shift circuit suitable for use in the phase feedback loop of FIG. 3 is shown. Although FIG. 4 shows in particular the reference phase shifter 500, the principles employed to create a phase shift are similar to those used in the control phase shifter of 530 of FIG. 3.

The reference phase shifter 500 and the control phase shifter 530 both employ fast analog multipliers to effect the trigonometrical identity $$\sin(a+b)=\sin(a)\cos(b)+\sin(b)\cos(a).$$

By letting "a" be time-variable, the identity becomes $$\sin(\omega t+b)=\sin(\omega t)\cos(b)+\cos(\omega t)\sin(b).$$

The master oscillator 130 (FIG. 2 and 3) generates a reference sine wave $\sin(\omega t)$. This is first passed through a buffer 600. The output of the buffer 600 is passed directly to a first fast analog multiplier 610. The output of the buffer 600 is also sent to a second fast analog multiplier 620, via a phase delay 630. In one embodiment, this may simply be an accurately measured length of cable to introduce a time delay between the buffer 600 and the second fast analog multiplier 620 such that a phase delay of 90° is introduced. Although this may be acceptable for certain applications, often the frequency of the reference sine wave may be adjustable. In that case, it is preferable to employ a stripline structure embedded into a circuit board to provide the 90° phase delay. This stripline structure may be provided with taps and jumpers to allow sub-nanosecond adjustment of the time delay, by reducing or increasing the effective length presented to the signal in between the buffer 600 and the second fast analog multiplier 620 so that the time delay and hence phase delay is altered.

By introducing a 90° phase delay, the input to the second fast analog multiplier 620 is $\sin(\omega t+90°)=\cos(\omega t)$. In order to complete the right-hand side of the trigonometrical identity above, DC values representing the sine and cosine of the desired phase angle b must be generated. Preferably, this is carried out by the control processor 110 (FIG. 2) in combination with one or more digital-to-analog converters (DACs) (not shown in FIG. 4) In presently preferred embodiments, the desired phase shift (the phase angle b relative to the phase of the reference sine wave) is factory pre-set and cannot be adjusted by an operator of the described controller. However, it is clearly possible, if necessary or desirable, that the host computer 108 (FIG. 2) could allow any phase angle b between 0 and 360° to be selected. The control processor 110 may, or example, then employ a look-up table to convert a desired phase angle b into the sine and cosine thereof for generation by the DACs.

The first and second fast analog multipliers 610, 620 are preferably high precision multipliers such as the AD834 or AD835 multipliers manufactured by Analog Devices. The former has a maximum frequency of 250 MHz, whereas the latter has a maximum frequency of 500 MHz.

The first fast analog multiplier 610 multiplies the reference sine wave $\sin(\omega t)$ with the DAC generated DC value representing $\cos(b)$. Similarly, the second fast analog multiplier 620 multiplies the reference cosine wave $\cos(\omega t)$ with the DAC generated DC value representing $\sin(b)$. The outputs of each of the two multipliers 610, 620 are added together by summer 640. The output of the summer 640 is thus $\sin(\omega t)\cos(b)+\cos(\omega t)\sin(b)$, which is $\sin(\omega t+b)$. In other words, the output of the reference phase shifter 500 is a sine wave having a phase shift relative to the phase of the reference sine wave of $b^0$. Again, by setting the desired phase shift b as b+90, the output of the summer becomes $\sin(\omega t+b+90)=\cos(\omega t+b)$.

The control phase shifter 530 operates in a similar manner; the reference sine wave is used to generate $\sin(\omega t)$ and $\cos(\omega t)$, and the control processor 110 (FIG. 2) controls the DACs so as to produce DC values equivalent to the sine and cosine of the output command phase angle x.

Referring again to FIG. 1, it will be noticed that there are, in fact, two rf accelerator cavities or stages 250, 251. The controller 100 is configured to control the phase of each cavity by using separate phase feedback loops such as are shown in FIG. 3, all tied to a single master oscillator 130 but using separate phase measurements from the pick-up loops 276, 277 in the two rf accelerator cavities 250, 251 respectively. It may, in certain circumstances, be desirable that there is a known, controlled phase shift between the two cavities. Using the principles described above in connection with FIG. 4, it is preferable that the first rf accelerator cavity 250 uses a signal at a phase angle $b_1$, relative to the phase of the reference sine wave generated by the master oscillator 130, and the second rf accelerator cavity 251 uses a signal controlled to a second phase angle $b_2$ relative to the phase angle of the reference sine wave generated by the same master oscillator 130. Thus, rather than adjusting the phase of one rf accelerator relative to the other, known phase angles are generated and controlled separately for each rf accelerator cavity. The relative phase shift between the two rf accelerator cavities (in this case, $(b_1-b_2)$) may be non-zero, or this value is either 0 or 180°. Even in this latter case, it is important to appreciate that the relative phase difference is not controlled so as to be zero, but rather the phase shift of each rf accelerator cavity is controlled to be the same relative to the phase of the reference sine wave generated by the master oscillator 130.

Figure 5:
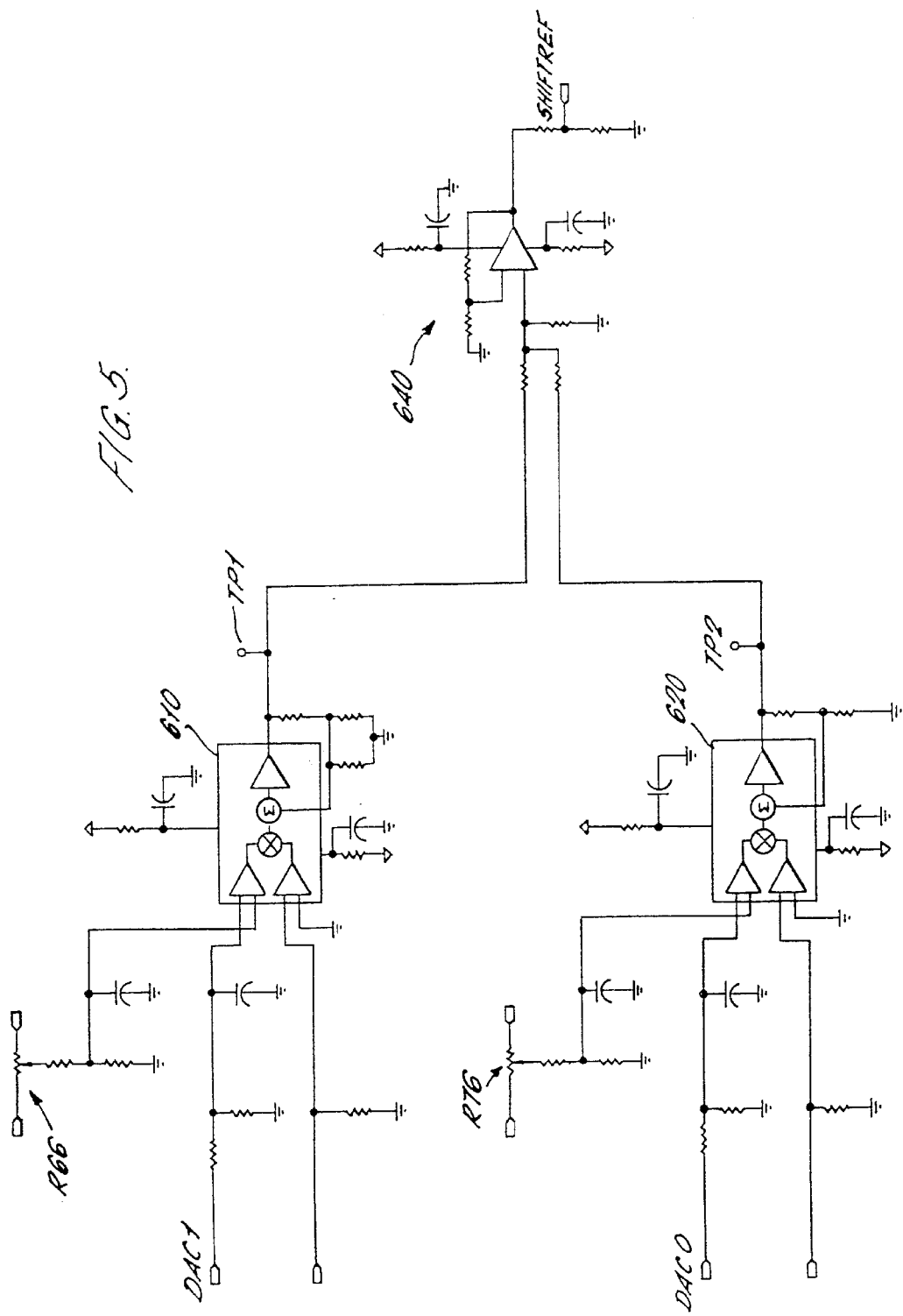
FIG. 5 shows a detailed circuit diagram of the phase shift circuit of FIG. 4.

Likewise, it will be understood that although, in FIG. 1, a single controller is shown for controlling both of the rf accelerator cavities 250, 251, separate controllers can be used for each, although a single master oscillator would still be necessary FIG. 5 shows a detailed circuit diagram of the phase shift circuit of FIG. 4. The signals labelled REFSINE and REFCOS are generated upon a communications board (not shown) and are available to each RF processor 100, should more than one processor be present. As will be explained in further detail in connection with FIGS. 7, 8a and 8b, and REFCOS are scaled using separate circuitry to an approximately equal amplitude of 1.0 V peak-to-peak. There are two main reasons for this. Firstly, using a signal with constant amplitude, errors arising from circuit non-linearities are eliminated. Secondly, the fast analog multipliers 610, 620 each have a maximum input voltage of only 1.25 V peak-to-peak.

The signal REFSINE represents the amplitude-scaled reference sine wave generated by the master oscillator 130, considered to have a notional phase angle of zero and mathematical representation $\sin(\omega t)$ Likewise, the REFCOS signal is derived from the reference sine wave generated by the master oscillator 130 and phase-shifted by exactly 90° relative thereto to generate an amplitude-scaled signal represented by $\cos(\omega t)$. Sin(b) and cos(b) are generated using digital-to-analog converters DAC0 and DAC1 respectively. In the preferred embodiment, the output of DAC1 is in fact a DC signal representative of $\cos(90+b)$, and the output of DAC0 is a DC signal representative of $\sin(90+b)$. This is to ensure that the ultimate output of the reference phase shifter 500 is $\sin(\omega t+b+90)$, i.e. $\cos(\omega t+b)$. The fast analog multiplier 610 and 620 multiply the output of DAC1 with the signal REFSINE and the output of DAC0 with the signal REFCOS respectively. Both multipliers are given an offset trim adjustment using resistors R66 and R76 respectively. These can be used to remove any DC offsets by monitoring the outputs of the fast analog multipliers 610, 620 at tap points TP1 and TP2 respectively.

Summing is carried out by the summer 640. Both inputs have equal gain. The output of the summer 640 is a cosine wave, $\cos(\omega t+b)$. In other words, the signal SHIFTREF is effectively a sine wave whose phase angle is shifted by $90^0+b$ relative to the reference sine wave generated by the master oscillator 130.

Figure 6:
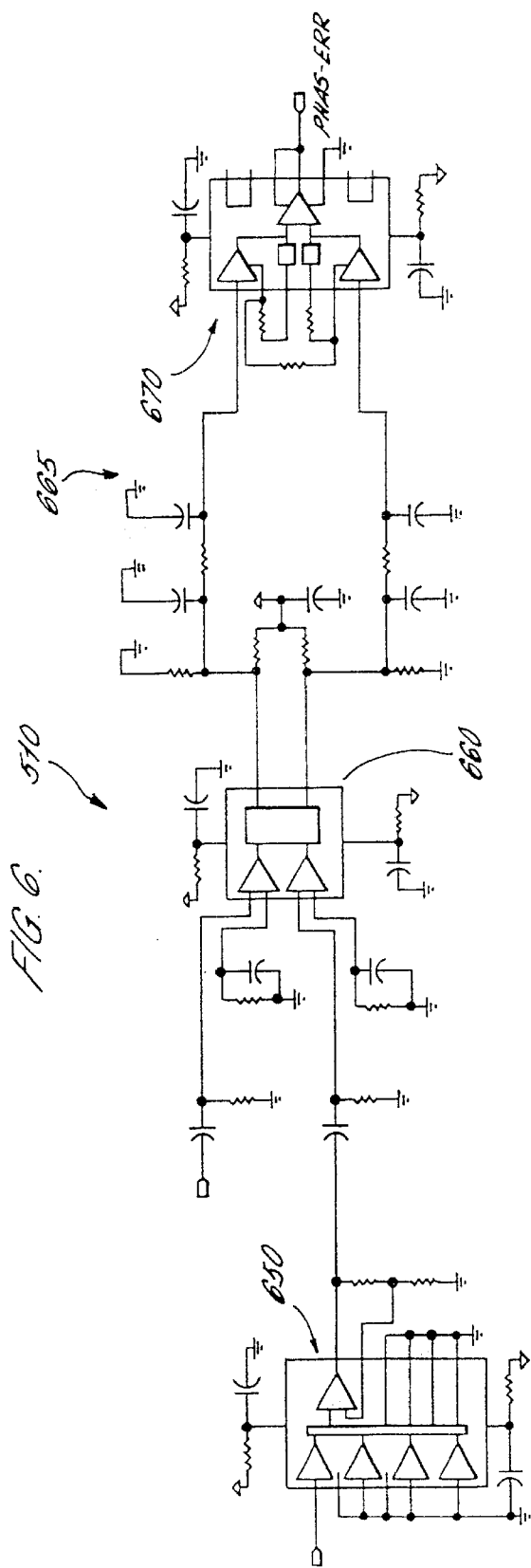
FIG. 6 shows a detailed circuit diagram of part of the phase feedback loop of FIG. 3.

FIG. 6 shows a detailed circuit diagram of another part of the phase feedback loop shown schematically in FIG. 3. Specifically, FIG. 6 shows, in more detail, the multiplier 510.

The signal SHIFTREF, representing $\cos(\omega t+b)$ is used as an input to a first buffered multiplexer 650. The first buffered multiplexer 650 tracks and compensates for any phase delay drifts that might occur at a matching multiplexer in the pick-up loop amplifier circuitry described below.

Figure 7:
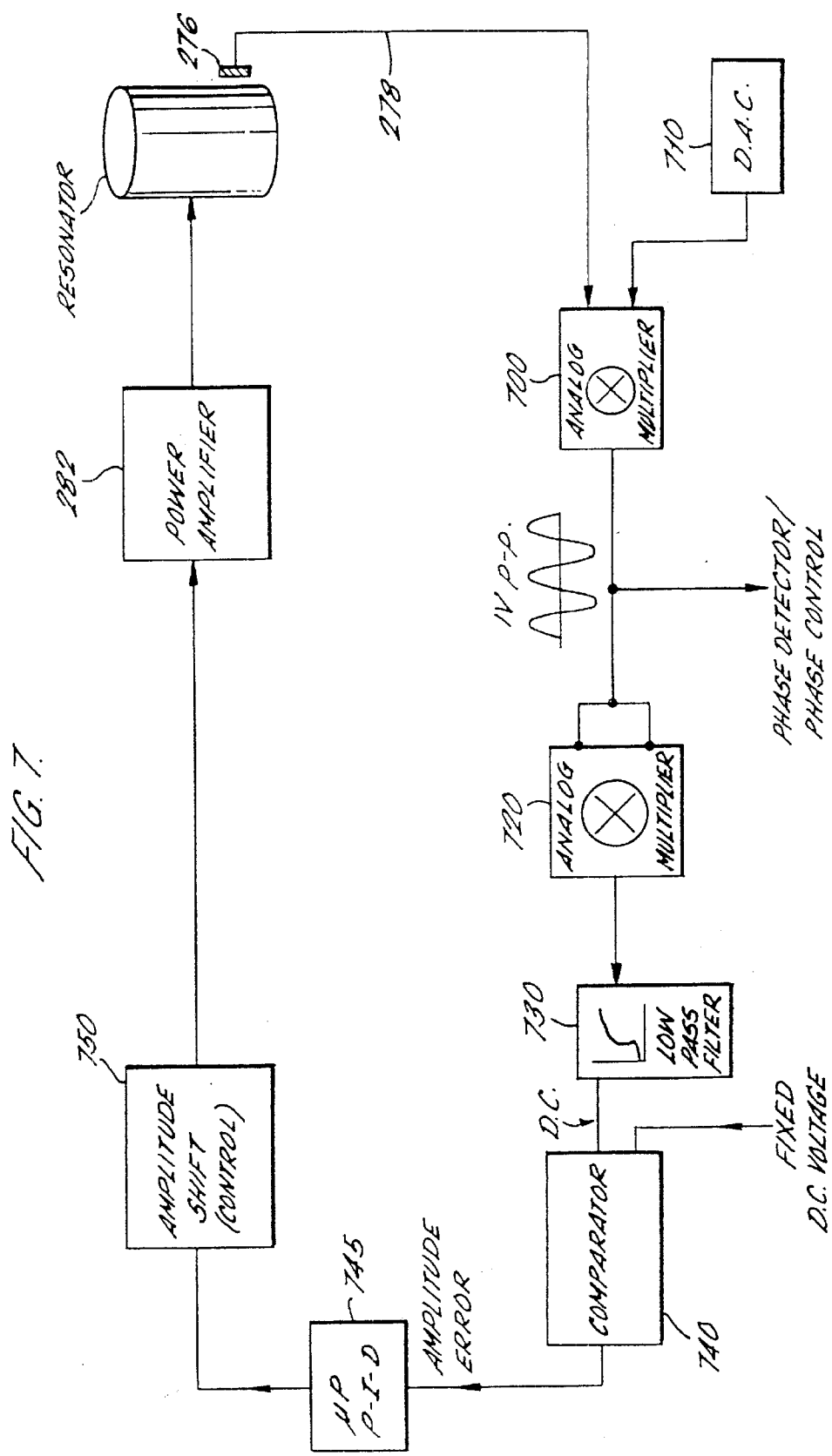
FIG. 7 shows a schematic diagram of an amplitude detection and control circuit embodying a further aspect of the invention.
Figure 8A:
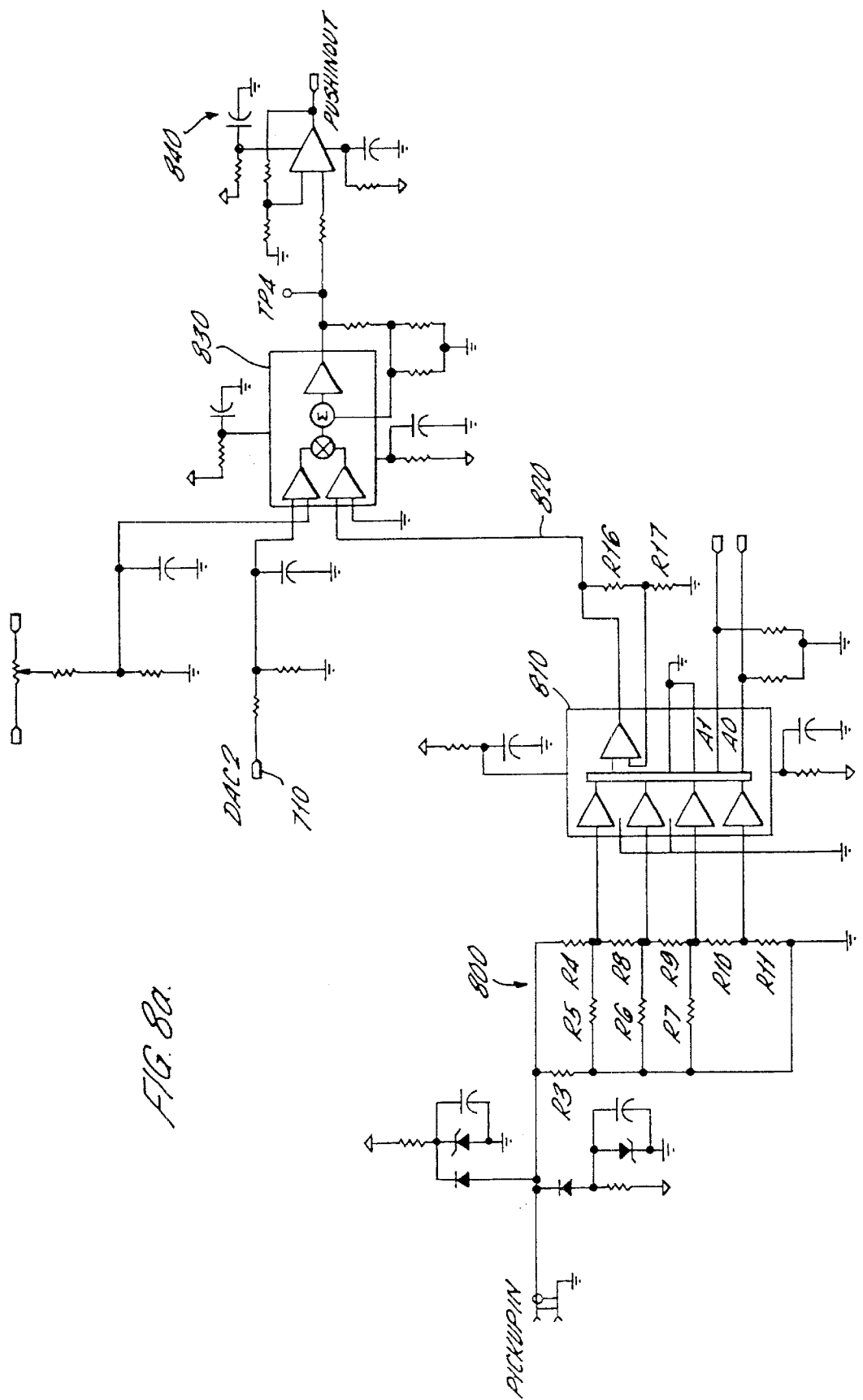
FIGS. 8a and 8b show detailed circuit diagrams of the amplitude detection and control circuit of FIG. 7.
Figure 8B:
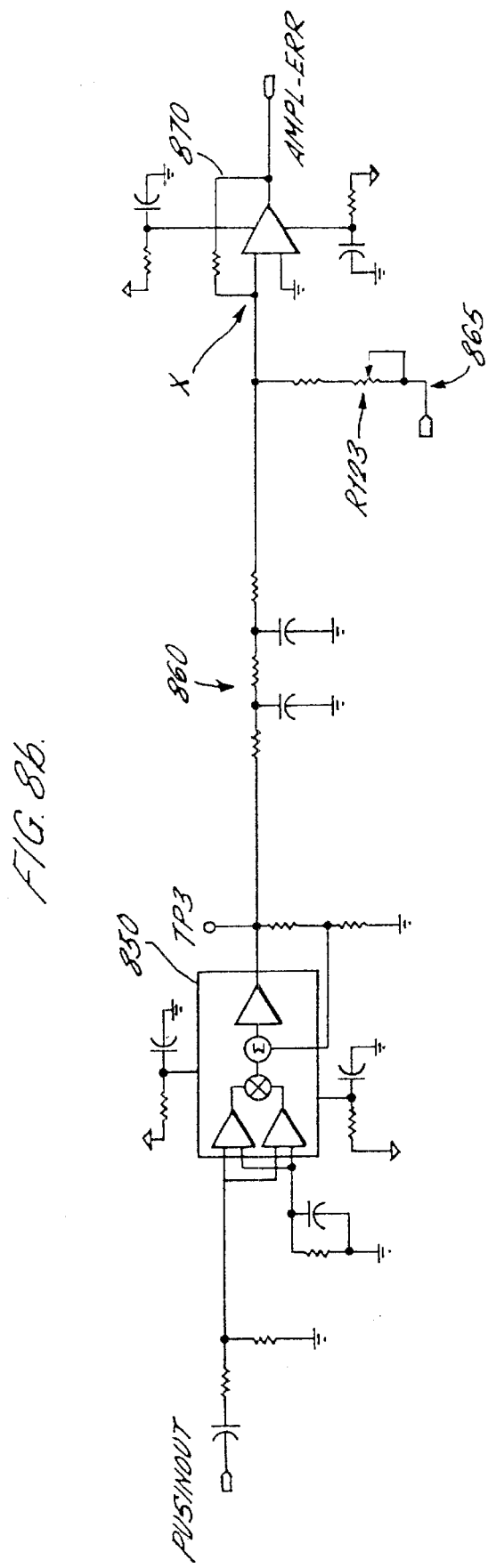

The signal from the pick-up loop 276 is available from line 278 (FIG. 1) as PUSINOUT. This signal has been scaled to a nominal voltage of 1 V peak-to-peak using amplitude detection circuitry (FIGS. 7, 8a and 8b).

The scaled pick-up loop signal PUSINOUT is multiplied with the signal SHIFTREF (which is also scaled, as previously explained) at third fast analog multiplier 660. The multiplier 660 is configured as a current-output multiplier. If the signals PUSINOUT and SHIFTREF differ by exactly 90°, the DC component of the output of the third analog multiplier 660 will be zero. Otherwise, the differential output of third fast analog multiplier 660 is converted to a voltage using resistors R103 and R104. The voltages are filtered using the low pass filter arrangement indicated generally at 665, before passing into a differential amplifier 670. The final phase error is provided as an output signal from the differential amplifier 670 which is labelled PHAS_ERR in FIG. 6. This signal PHAS_ERR is used to generate suitable values for sin(x) and cos(x) for use as inputs to the control phase shifter 530 (FIG. 3).

FIG. 7 shows, again schematically, a circuit for amplitude detection and control. The signal from the pick-up loop 276 is attenuated by one of a range of fixed fractions in order that it is less than 1.25 V. The attenuated signal is used as a first input to a fourth fast analog multiplier 700, which is why attenuation by a fixed fraction is necessary.

The other input to the fourth fast analog multiplier 700 is derived from a third digital-to-analog converter 710. The DAC710 provides a variable amplitude DC output such that the product of the fourth fast analog multiplier 700 is a sinusoidal signal having a phase angle relative to the master oscillator 130 which should be approximately b°, assuming phase control of the resonator signal. This amplitude scaled signal is used in the phase feedback loop of FIG. 3 and is labelled PUSINOUT in FIG. 6. The use of a variable gain amplifier in the form of a fast analog multiplier to scale a signal of arbitrary amplitude to a fixed reference amplitude is also employed to generate the signals REFSINE and REFCOS in FIGS. 4 and 6. It will of course be understood that scaling the amplitude of the signals using this technique should not affect the phase of the signals which is why the amplitude and phase feedback loops can notionally be shown separately. However, scaling the amplitude of the signals eliminates the problem of non-linearities present in peak detection devices.

The amplitude scaled signal from the pick-up loop 276 is then squared by a fifth fast analog multiplier 720. This is achieved by supplying the output of the fourth fast analog multiplier 700 to both inputs of the fifth fast analog multiplier 720.

The output of the fifth fast analog multiplier 720 is filtered using a low pass filter 730, to generate a DC signal. This is compared in comparator 740 with a fixed DC voltage and the output of the comparator 740 is thus an amplitude error representing the difference between the scaled amplitude of the pick-up loop relative to the fixed DC voltage.

The amplitude error is supplied to a microprocessor 745 for use in a feedback algorithm. The microprocessor determines the output amplitude and chase. This is fed to an amplitude shifter 750 which adjusts the amplitude of the output command wave form to the power amplifier 282. This in turn adjusts the amplitude of the signal supplied to the resonator in order to drive the amplitude error signal cowards zero.

FIG. 8a shows, in greater detail, a part of the schematic circuit of FIG. 7. The raw signal from the pick-up loop 276 is passed through a high precision resistive attenuator 800 (R5-R11). Each of four taps on the attenuator 800 represents a factor of 2.5, so that the pick-up loop signal can be reduced in amplitude by factors of 1.0, 2.5, 6.25, and 15.625. Resistors R3 and R4 are used to apply an overall attenuation of 0.75. The selection of any of the four taps associated with the resistive attenuator 800 is carried out by selection of one of the four channels of a second buffered multiplexer 810. Inputs A0 and A1 are used for this purpose.

The second buffered multiplexer 810 also includes a fixed gain stage with a gain of 2.0, determined by the resistors R16 and R17. The signal on output line 820 thus has an amplitude of between 0.4 and 0.8 V peak-co-peak. It should be appreciated, however, that the signal on line 820 is still a fixed fraction of the raw pick-up loop signal PICKUPIN.

A sixth fast analog multiplier 830 receives as one of its inputs the attenuated signal on line 820. The other input is determined by the value of DAC2, which is the DAC710 shown schematically in FIG. 7. The raw output of DAC2 is 10.0 V full-scale. Thus, this signal is attenuated by resistors R19 and R20, so that the input to the multiplier supplied by DAC2 ranges from 0 to 1.25 V, the latter being the maximum input voltage to the multiplier 830. Assuming the desired input amplitude, the combination of the resistive attenuator 800 and the sixth fast analog multiplier 830 produces a signal at tap point TP4 of 0.3 V peak-to-peak.

Amplifier 840 multiplies the sinusoidal signal received from the sixth fast analog multiplier 830 by a factor of 3.3. Thus, the output of the amplifier 840, labelled PUSINOUT, may be a sinusoidal signal having a amplitude of 1.0 V peak-to-peak. As previously explained, this signal PUSINOUT is used in the phase comparator shown in FIG. 6.

Turning now to FIG. 8l, the signal PUSINOUT is reduced by a factor of 0.7 and then supplied to both inputs of a seventh fast analog multiplier 850. The output of the seventh fast analog multiplier 850 is then the square of the input, i.e. a positive wave form with an RMS value of 0.5 V. This signal is available at tap point TP3.

A low pass filter arrangement 860 receives the output of the seventh fast analog multiplier 850 and the output of the low pass filter arrangement 860 is in turn a DC signal of +0.5 V.

A reference voltage of –0.5 V is generated by a voltage source and resistor arrangement 865. This is added to the notional +0.5 V signal which is the output of the low pass filter arrangement 860. The voltage at circuit node X in FIG. 8b is thus notionally zero. A summing junction 870 has a gain of 20x and amplifies the difference between the non-inverting input, held at ground potential, and the inverting input which is notionally at 0.0 V. The output of the summing junction 870 is an amplitude error, labelled AMPL_ERR in FIG. 8b, which will be either positive or negative depending upon whether the original raw pick-up signal amplitude is larger than it should be (i.e. the output of the low pass filter arrangement 860 is larger than the reference voltage), or smaller than it should be. A 10 mV output from the summing junction 870 represents a 0.1% signal amplitude error.

Trim potentiometer R123 is used to null out any offsets in the circuit; in practice a known signal is injected into the lefthand side of FIG. 8a in lieu of the PICKUPIN signal from the pick-up loop 277. The gains and attenuators in FIGS. 8a and 8b are set to a theoretical value, and trim potentiometer R123 is adjusted to produce 0.0 V at the output of the summing junction 870.

Table 1 below summarises the signal amplitudes between PICKUPIN and AMPL_ERR:

TABLE 2

| | PICKUPIN (VP-P) | Output of Attenuator 800 (V p-p) | Output of Second BUFF · MUX (810) (V p-p) | Output of DAC2 (V p-p) | Output of Multiplier 830 (V p-p) |
|---|---|---|---|---|---|
| Voltage 1 | 0.2–0.5 | 1 | 0.3–0.75 | 1.0–0.4 | 0.3 |
| Voltage 2 | 0.5–1.2 | 2.5 | 0.3–0.75 | 1.0–0.4 | 0.3 |
| Voltage 3 | 0.5–1.2 | 6.3 | 0.3–0.75 | 1.0–0.4 | 0.3 |
| Voltage 4 | 3.0–7.5 | 16 | 0.3–0.75 | 1.0–0.4 | 0.3 |

| | PUSINOUT (V p-p) | Input to Multiplier 850 (V p-p) | Output of Multiplier 850 (V RMS) | Output of LPF (dc V) | AMPL_ERR |
|---|---|---|---|---|---|
| Voltage 1 | 1.0 | 0.7 | 0.5 | 0.5 | 20 × 0.0 |
| Voltage 2 | 1.0 | 0.7 | 0.5 | 0.5 | 20 × 0.0 |
| Voltage 3 | 1.0 | 0.7 | 0.5 | 0.5 | 20 × 0.0 |
| Voltage 4 | 1.0 | 0.7 | 0.5 | 0.5 | 20 × 0.0 |

Figure 9:
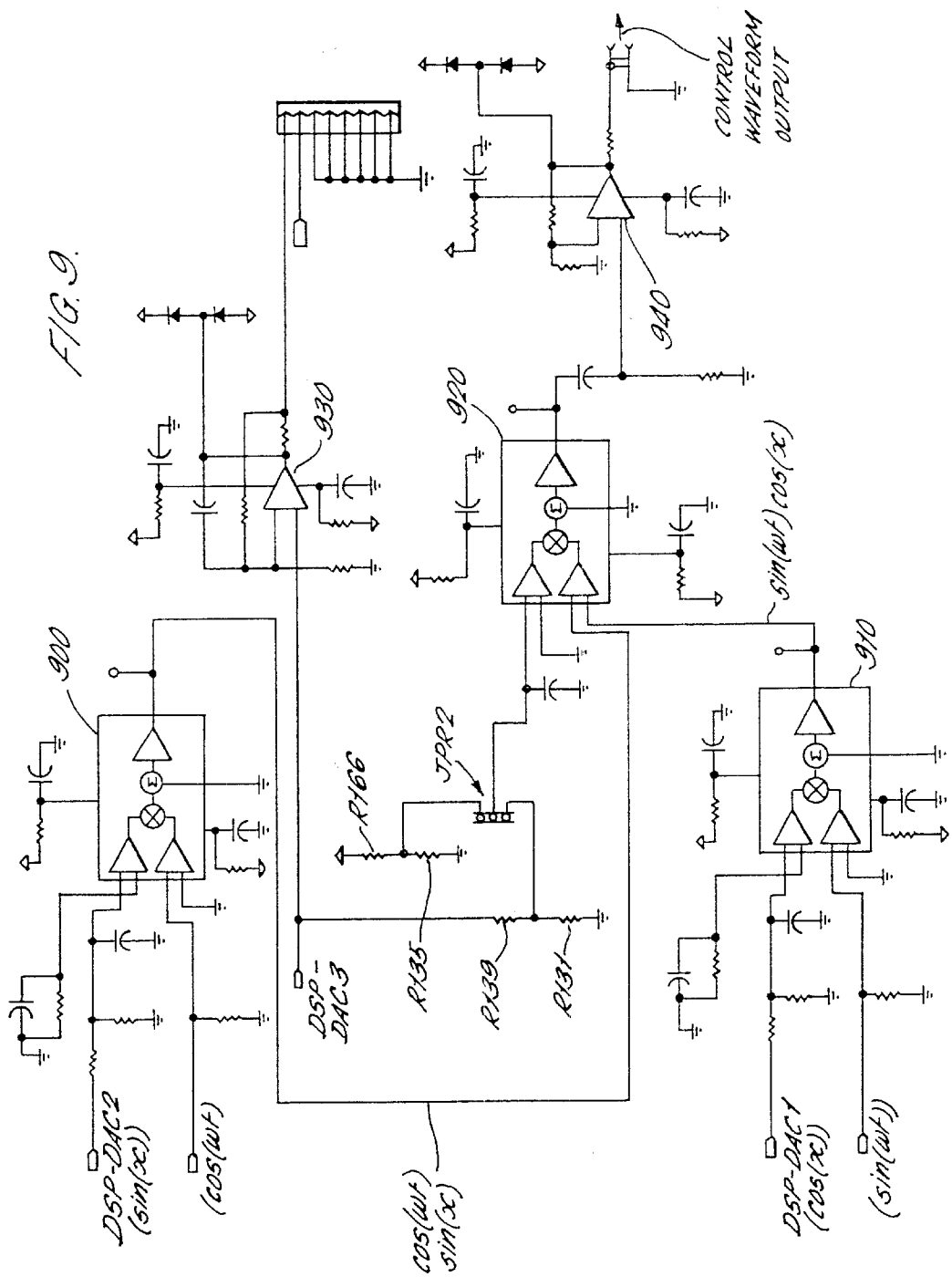
FIG. 9 shows a detailed circuit diagram of the overall phase and amplitude control of the output command supplied to the resonator amplifier of FIG. 1.

FIG. 9 shows a detailed circuit diagram of the overall phase and amplitude control of the output command supplied to the resonator amplifier of FIG. 1. The signals PHAS_ERR shown in FIG. 6 and AMPL_ERR shown in FIG. 8$b$ are supplied to the control processor 110 (see FIG. 2). The control processor 110 implements a proportional integral differential (PID) algorithm to calculate suitable command values to drive the amplitude and phase errors to zero. Both PHAS_ERR and AMPL_ERR are read by fast, 16-bit analog-to-digital converters (not shown) The algorithms for calculating the command DC sine and cosine signals (referred to in FIG. 3 as sin(x) and cos(x)) and likewise the amplitude command voltage are preferably implemented using firmware and do not form a part of the present invention.

The output command phase shifts cos(x) and sin(x) are generated by digital-to-analog converters under the control of the control processor processor 110. Cos(x) is generated by digital-to-analog converter DSP-DAC1 and sin(x) is generated by DSP-DAC2. As seen in FIG. 9, these are multiplied with the reference sine wave sin(ωt) and the reference cosine wave cos(ωt) using eighth and ninth fast analog multipliers 900, 910 respectively. The reference sine and cosine waves are generated from the master oscillator 130. The products, cos(ωt)sin(x) and sin(ωt)cos(x), are summed to produce a first input to a tenth fast analog multiplier 920. The other input to the tenth fast analog multiplier 920 is an amplitude scaling factor to scale the command wave for having the command phase shift x. The jumper labelled JPR2 permits selection between two modes of operation of amplitude control. In a first, "variable output" mode, the control processor 110 calculates a scaling factor in dependence upon the amplitude error AMPL_ERR and provides an output from digital-to-analog converter DSP-DAC3. The output of DSP-DAC3 is used as an amplitude control for amplifier 930. In other words, the phase control signal (the first input to the tenth multiplier 920) is amplitude-modulated with a variable amplitude control signal.

The raw output from DSP-DAC3 is first attenuated by a factor of eight through the divider provided by resistors R139 and R131. The resulting level is the amplitude of the command Rf signal. The output of the tenth fast analog multiplier 920 is buffered through buffer 940 to generate a scaled, phase-shifted control wave form at the circuit output. This variable output mode is selected by shorting pins 2 and 3 of the jumper JPR2.

In a second, "fixed output" mode, the amplitude control signal is a DC signal reflecting the value of the output from DSP-DAC3, again as buffered by amplifier 930. The signal has a range of 0–10 V DC. In the fixed output mode, the rf output amplitude signal at the tenth analog multiplier 920 (pin 8) is determined by the voltage divider represented by resistors R166 and R135. The fixed output mode is selected by shorting pins 1 and 2 of jumper JPR2.

RF linear accelerators find application in a number of areas of technology. However, they are of particular use in the acceleration of ions in an ion implanter. Such implanters allow the doping of silicon wafers and the like with dopant ions such as boron or phosphorous.

Figure 10:
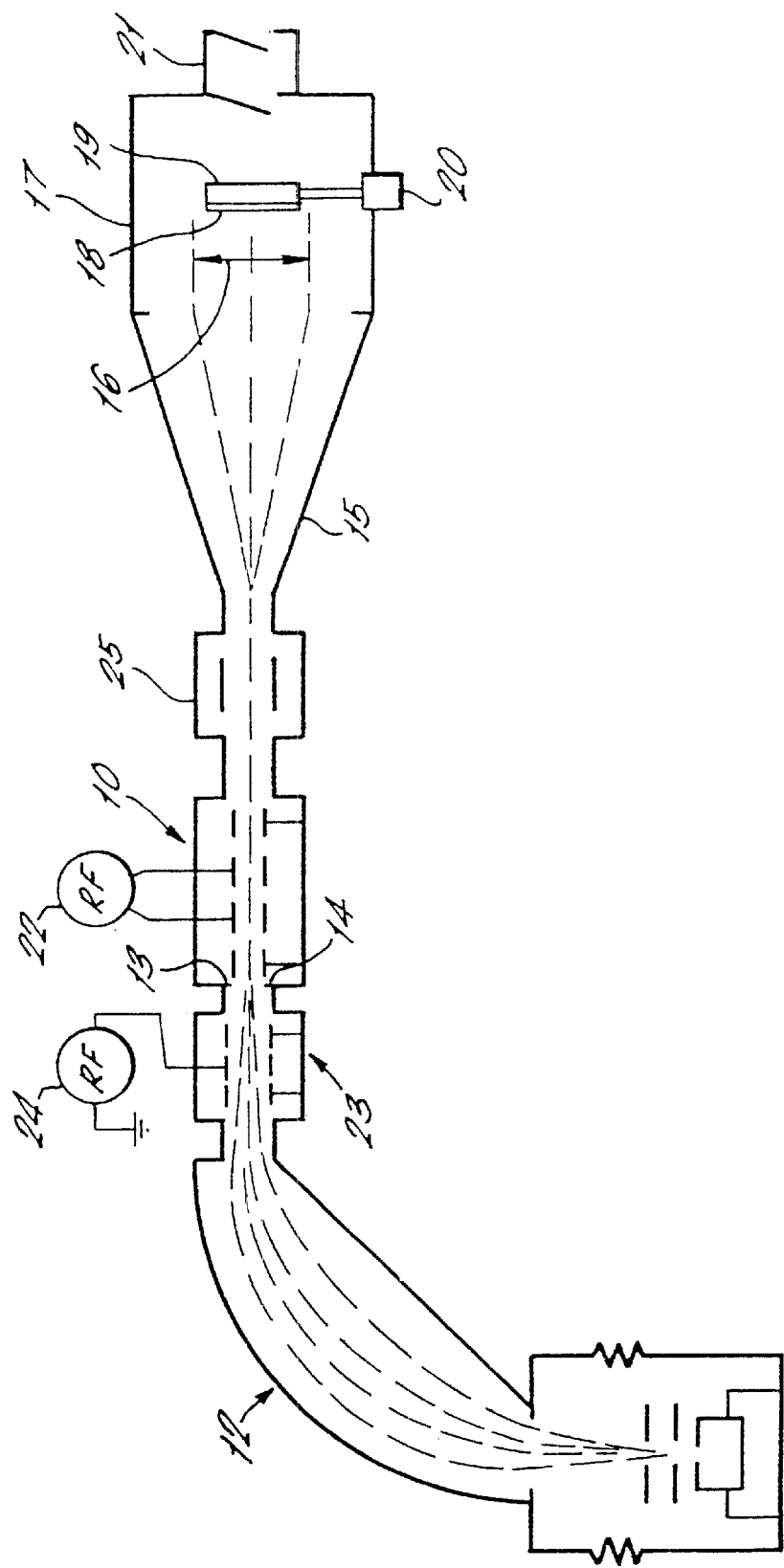
FIG. 10 shows a schematic view of an ion implanter including the rf accelerator assembly and controller of FIG. 1.

FIG. 10 illustrates schematically a single wafer implanter incorporating a radio frequency linear accelerator assembly 10. The rf accelerator assembly 10 is shown in highly schematic form and represents a single three-gap rf booster having two central electrodes. It is also to be understood that the implanter of FIG. 10 is illustrated simply to put the controller described above into context and is not intended of itself to represent a part of the present invention.

In the simplified arrangement of FIG. 1, the implanter comprises an ion source 11 directing a beam of ions at a predetermined energy E into an analyser magnet 12, which passes ions according to their mass to charge ratio (m/e) into a buncher 23, supplied with rf power from an rf source 24. Only ions of the required velocity times mass/charge (m/e) ratio pass through a mass selection (resolving) slit 13 at the exit of the buncher 23, and enter as a beam 14, still at energy E, into the radio frequency accelerator assembly 10. The beam exiting the rf accelerator assembly 10 then enters an energy analyser 25, after which it enters a beam scanning device 15 which is arranged to scan the ion beam to and fro in a direction 16 transverse to the beam direction. The scanning device 15 may be either electrostatic or electromagnetic. Electromagnetic scanning systems are preferred in applications especially for high current beams. A suitable electromagnetic scanning system is disclosed in U.S. Pat. No. 5,393,984. The scanned beam then enters a process chamber 17 in which a semiconductor substrate 18 is held on a holder 19. The holder 19 is mounted on a mechanical scanning mechanism shown generally at 20 which can be actuated to reciprocate the wafer in a direction normal to the plane of the paper in FIG. 1 and across the plane of the scanned beam. The combination of scanning of the beam and mechanical scanning of the wafer holder 19 allows the beam to scan over all parts of the wafer during an implant process. Processed wafers are removed from the holder 19 and passed out of the process chamber 17, and fresh wafers for processing are brought into the chamber 17 and mounted on the holder 19 one at a time, via a load lock 21, and using robot handling mechanisms which are not shown in this drawing for simplicity.

Further details of single wafer implanters can be determined from U.S. Pat. Nos. 5,003,183 and 5,229,615, and of a preferred form of process chamber from International Patent Application WO 99/13488. The specific details of the ion source, the mass selection magnet and the scanning and processing mechanisms of the implanter are not crucial to aspects of the present invention, which concern solely the arrangement of an rf accelerator assembly which may be used to increase the energy of ions in implanter such as disclosed in the above prior art documents.

It should be understood that rf accelerators are equally suitable for use in batch implanters, which typically rely solely on mechanical scanning to process a batch of semiconductor wafers simultaneously. The wafers are usually mounted around the periphery of a rotating wheel, which rotates to bring the wafers one by one across the line of the ion beam. Meanwhile, the axis of rotation of the wheel is reciprocated to and fro to complete the scanning in the orthogonal direction.

The accelerator assembly shown in FIGS. 1 and 10 is intended to handle and accelerate primarily the ions $B^{++}$(m/e=5.5), $B^+$(m/e=11), $P^{++}$(m/e=15.5), and $P^{+++}$(m/e=10.3. The structure parameters of the accelerator assembly are designed to be near optimum for the $B^{30}$ ions. However, for ion implantation applications, useful energy gains from at least the first booster stage can be obtained for ions with an m/e range up to about 40.

What is claimed is:

1. A controller for controlling the amplitude of an rf signal in an rf resonator having an rf power supply, comprising:

a signal processor means configured to receive as a first input, a transduced signal representative of the amplitude of the rf signal, and to receive, as a second input, a command scaling signal having a predetermined amplitude, the signal processor means being arranged to generate a scaled transduced signal having an amplitude scaled by an amount directly proportional to the predetermined command scaling signal amplitude;

means for generating a reference signal having a reference amplitude;

a comparator arranged to compare the amplitude of the scaled transducer signal with the reference amplitude of the reference signal and to generate an amplitude error signal representative of the difference between the scaled transducer signal amplitude and the reference signal amplitude;

the signal processor means being further arranged to adjust the output of the rf power supply in dependence upon the amplitude error signal so as to minimize the subsequent difference between the scaled transducer signal amplitude and the reference signal amplitude.

2. The controller of claim 1, in which the signal processor means includes a multiplier arranged to multiply the transduced signal with the command scaling signal in order to generate the said scaled transduced signal.

3. The controller of claim 2, in which the multiplier is an analog multiplier, the controller further comprising a digital-to-analog converter (DAC) for generating the said command scaling signal.

4. The controller of claim 2, in which the signal processor means further includes a signal attenuator for attenuating the transduced signal amplitude by a fixed fraction prior to multiplication thereof with the said command scaling signal.

5. The controller of claim 4, in which the signal attenuator includes a plurality of attenuator stages, each of which attenuates the transduced signal by a different fixed fraction.

6. A method of controlling the amplitude of an rf signal in an rf resonator having an rf power supply, comprising the steps of:

(a) receiving a transduced signal representative of the amplitude of the rf signal;

(b) generating a command scaling signal having a predetermined amplitude;

(c) generating a scaled transduced signal having an amplitude scaled by an amount directly proportional to the predetermined command scaling signal amplitude;

(d) generating a reference signal having a reference amplitude;

(e) comparing the amplitude of the scaled transducer signal with the reference signal;

(f) generating an amplitude error signal representative of the difference between the scaled transducer signal amplitude and the reference signal amplitude; and (g) adjusting the output of the rf power supply in dependence upon the amplitude error signal so as to minimize the subsequent difference between the scaled transducer signal amplitude and the reference signal amplitude.

7. The method of claim 6, in which the step (c) of generating a scaled transduced signal comprises: multiplying the received transduced signal with the generated command scaling signal.

8. The method of claim 7, the step (b) further comprising: generating the command scaling signal as a digital signal, and converting the said digital signal to an analog signal for analog multiplication with the said received transduced signal.

9. The method of claim 7, further comprising attenuating the transduced signal amplitude by a fixed fraction prior to the step of multiplying it with the said command scaling signal.

* * * * *